Figure 1A:
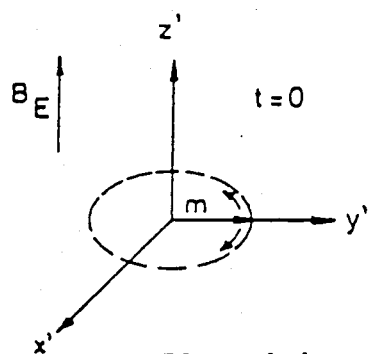

United States Patent [19]

Sepponen

[11] Patent Number: 4,654,594
[45] Date of Patent: Mar. 31, 1987

[54] METHOD OF ANALYSING THE STRUCTURE AND CHARACTERISTICS OF AN OBJECT

[75] Inventor: Raimo Sepponen, Helsinki, Finland

[73] Assignee: Instrumentarium Corp., Finland

[21] Appl. No.: 561,339

[22] Filed: Dec. 14, 1983

[30] Foreign Application Priority Data

Dec. 17, 1982 [FI] Finland .................................. 824343

[51] Int. Cl.$^4$ ............................................. G01R 33/20
[52] U.S. Cl. .................................... 324/309; 324/307
[58] Field of Search ............... 324/300, 307, 312, 309, 324/311

[56] References Cited

U.S. PATENT DOCUMENTS 4,431,968  2/1984  Edelstein .............................. 324/309

Primary Examiner—Michael J. Tokar
Attorney, Agent, or Firm—Andrus, Sceales, Starke & Sawall

[57] ABSTRACT

The invention relates to a method of recovering nuclear spin or NMR information about a target, such as a human body placed in at least substantially homogenous magnetic field, a desired part of the target being excited by means of a radiofrequency magnetic field which preferably deviates nuclear magnetization through 90°, a so-called spin echo is generated by utilizing a second excitation of the target volume which preferably deviates nuclear magnetization through 180°, said spin echo is recorded and said excitation sequence is repeated. At least one magnetic field is applied to the target in a manner that the duration and/or amplitude of said magnetic field gradient are varied between various repetitions, so that the difference between the absolute values of time integral of a value following said 180° pulse and a value preceding said 180° pulse of said magnetic field gradient obtains a different value. This way, the use of bipolar current sources is avoided. The invention is well adaptable to recovering information quickly especially about a plurality of image planes from a three-dimensional target.

27 Claims, 12 Drawing Figures

METHOD OF ANALYSING THE STRUCTURE AND CHARACTERISTICS OF AN OBJECT

The present invention relates to a method of collecting NMR information (NMR=Nuclear Magnetic Resonance) from an object or target specimen, such as a human body.

NMR information relates to density distribution of the target core in a volume to be examined, local distribution of relaxation times $T_1$ and $T_2$ associated with the core, and local distribution and rate of flow of the core to examined occurring in a target volume.

NMR method has been applied in chemistry almost since the experimental discovery of the nuclear magnetic resonance phenomenon (in 1945). In chemistry, the matter is examined by means of so-called NMR spectrometers whose sample volume is a few milliliters. The application of NMR in medical diagnostics was encouraged, among other factors, by observations of the differences between the relaxation times $T_1$ of cancer tissue and normal tissue.

NMR or nuclear spin imaging, which means the collection of NMR information about a three-dimensional target specimen, did not develop until in the 1970s. At the present time, a plurality of nuclear spin imaging methods are known in the art. The following is a review of the prior art methods which have been categorized in point mapping, line mapping, plane imaging and volume imaging methods.

In point mapping methods, the measuring arrangement is effected by aligning inside a target nearly a dot- or point-shaped volume which contains material that is examined from outside the target. The dot-shaped area can be displaced in a target either electrically or mechanically by displacing a measuring apparatus or said target. Point mapping has been described in the reference Garroway et al: U.S. Pat. No. 4,021,726 and Damadian: U.S. Pat. No. 3,789,839; Damadian et al: Science, vol. 194 (4272), Dec. 24, 1976 p. 1430...1432; Damadian: DE application No. 2946847; Abe: U.S. Pat. No. 3,932,805; Crooks et al: U.S. Pat. No. 4,318,043. Moore et al: U.S. Pat. No. 4,015,196. Point mapping methods are slow and cannot be considered medically interesting unless their diagnostic applicability is increased by special arrangements. Note e.g. Sepponen: FI application No. 811733.

Line mapping methods are more effective than point mapping methods since the NMR information of a target is collected from a linear volume element or voxel which is electrically or mechanically displaced in a target or object. The distribution of NMR information on the line area is found out by effecting the signal collection with a magnetic field gradient across the line and by running a frequency analysis on the recorded signal. Line mapping has been described in the references: Moore et al: U.S. Pat. No. 4,015,196, Sepponen: FI Pat. No. 58868; Garroway et al: U.S. Pat. No. 4,021,726; Crooks et al: U.S. Pat. No. 4,318,043; Hutchison et al: U.S. Pat. No. 4,290,019. Line mapping methods are also too slow for the nuclear spin imaging of a three-dimensional target but they may have significance in certain special applications.

Plane imaging methods produce an image of a slice-shaped area of a target. The direction of a slice in the target can be selected completely electronically. Selection of a slice can be done by using so-called selective excitation, meaning that during the excitation, a field gradient is coupled across the target and the frequency band of an excitation pulse is limited by suitably modulating said excitation pulse. Other prior known methods include designing a magnetic field across the target in a manner that the field is homogeneous only in the imaging plane and outside this plane the magnetic field alters very quickly, or the use of temporarily varying field gradients (Moore et al: U.S. Pat. No. 4,015,196).

Also known in the art is the use of gradients in an exciting radiofrequency pulse and the proper modulation of this pulse coupled with the amplitude and magnetic field gradients of said pulse.

Plane imaging methods can be developed further into volume imaging methods for production of a three-dimensional image of a target. A method described in the reference Lauterbur: Nature, vol. 242, Mar. 16, 1973, p. 190...191 is based on the reconstruction of the internal structure of a target by using projections drawn from said target by means of a magnetic field gradient. A drawback in this method is the homogeneity of a basic magnetic field required by the method, other drawbacks including the location dependency of the resolution of an imaging result as well as the phase and level errors occurring in recording the signal which must be corrected programmatically afterwards (Lai et al: J. Phys. E: Sci. Instrum., vol. 14, 1981 p. 874...879).

Image of a target or object can also be produced by utilizing the phase information of a nuclear magnetic resonance signal. Such methods are generally called Fourier methods and described in the following references: Ernst: U.S. Pat. No. 4,070,611; Hutchison et al: International patent application WO No. 81/02788. The imaging rate of speed can be increased by using the phase information, as set out in the references: Edelstein et al: GB application No. 2 079 463; Mansfield: U.S. Pat. No. 4,165,479; Hinshaw: Physics Letters, vol. 48A, No. 2, June 3, 1974, p. 87...88; Likes: U.S. Pat. No. 4,307,343.

The most popular nuclear spin imaging methods at present are based on exploitation of the phase and frequency information of a nuclear magnetic resonance signal. One such prior art method is described in the reference Ernst: U.S. Pat. No. 4,070,611. According to this prior art method, a target volume is repeatedly excited by using so-called 90° pulses, i.e. pulses which turn the magnetization of the nuclei in said target volume 90° away from the direction of an external magnetic field. After this, magnetic field gradients are coupled successively across the target volume in two or three directions orthogonal to each other. A signal inducing from a target to a recording apparatus, a so-called FID (Free Induction Decay), is recorded when the last of the field gradients (a registration gradient) is coupled on. Each time the excitation is effected, the on times of field gradients preceding said registration gradient are changed. Thus, the preceding gradient fields have effect on the phase of a signal being recorded. Now, by recording N FID signals for a two-dimensional image of N×N image element (respectively $N^2$ FID elements for a three-dimensional image) and by effecting a two- or three-dimensional Fourier modification with respect to the on times and recording times of modulating signals, the result obtained will be a two- or three-dimensional image of a target.

The most serious drawback in this method is the effect of the basic field inhomogeneities on a signal being recorded. Since the recording moment of a signal is shifted relative to an excitation pulse, also the modulating action of field inhomogeneities changes. The resulting error is difficult to compensate for.

The above-described method can be somewhat improved by applying the approach set forth in reference Hutchison et al: WO No. 81/02788 to generate a kind of spin echo and by modulating the phase of a signal with a gradient field orthogonal relative to a recording signal, said field being coupled on for a standard period of time and its amplitude being varied according to excitation times. A drawback with this method is that the described way of producing a kind of spin echo does not compensate for field inhomogeneities but, instead, there is a standard error remaining in phase information. In principle, a standard or constant phase error does not affect the quality of an image but, in practice, the inhomogeneity leads to the extenuation of signal/noise ratio and renders the collection of $T_2$ information impossible. Furthermore, the above method of utilizing the reversal of a field gradient for the generation of a spin echo requires gradient current sources which are capable of controlling a bidirectional current in all gradient directions. Such bipolar current sources and complicated and bulky.

Prior known in the art is also a modification of the above method, wherein spin echo is produced by using a 180° pulse. An advantage of this method over the former is that it compensates for the inhomogeneities of a basic field. However, in the method set forth in reference to Edelstein et al: Proceeding of an International Symposium on NMR Imaging Winston-Salem, N.C., Oct. 1 . . . 3, 1981, p. 139 . . . 144, a disadvantage is constituted by the bipolar current sources required thereby for controlling at least one field gradient.

The above method of generating spin echo by means of a 180° pulse has been used to accelerate the relaxation of a nuclear spin system. This method, set out in application Young: European patent application No. 55919, combines a 90°, 180° and another 90° pulse in a manner that the latter pulse returns nuclear magnetization to its state of rest. Due to the internal relaxation processes of matter, such return is not complete but it is nevertheless necessary to wait a certain delay until the phase sequence can be repeated. It should be emphasized that the subject matter of the cited reference deals with an imaging method itself instead of the phase coding of a nuclear system. As a matter of fact, the method disclosed in the cited application for acceleration of the recovery of a nuclear system has been anticipated at least in publication: Becker, Ferretti, Farrar: J. Am Chem. Soc. Vol. 91, p. 7784 (1969) and in the literature the method termed as Driven Equilibrium Fourier-Transform (DEFT).

Characteristics of a spin echo have also been used in line mapping methods, as set out in reference Crooks et al: U.S. Pat. No. 4,318,043. However, a line mapping image collected this way is poor in its resolution since resolution depends of the selectivity of excitation pulses. Neither is the phase information contained in a signal utilized in processing the signal.

Another prior art method has been anticipated in reference Brunner, Ernst: Journal of Magnetic Resonance vol. 33, p. 83 . . . 106 (1979) for imaging a plurality of individual planes of a target volume by applying selective excitation in a manner that successive planes are excited during relaxation of the first plane. In this straightforward embodiment of the method, the signal of each plane must be recorded separately and, thus, the linking speed of gradients must be high.

The present invention relates to a method of utilizing a so-called spin echo phenomenon for the collection of NMR information as effectively as possible and by using simple equipment. An object of the invention is also to provide a method for collection of NMR information without highly strict requirements for the homogeneity of a basic magnetic field. Another object of the present method is quick mapping of a target volume for quick discovery of certain changes and to use this information further for effecting a closer examination of the changed volume. A further object of the invention is to provide a method, wherein the above drawbacks of the prior art methods are eliminated.

The essential characteristics of the invention are set forth in claim 1 and other features inherent of the invention in the subclaims. When applying the method of the invention, bipolar current sources are not needed. Thus, the measuring assembly required by the method is relatively simple and the gradient changing speeds necessary are as low as possible. The method can be further developed into a high-speed imaging method for the collection of a plurality of individual image planes of a three-dimensional target. Thus, by utilizing the characteristics of a 180° pulse, it is possible to read the signals of successive planes in a manner that the signals are separated on time axis and hence to speed up the examination of a target and to use lower linking speeds of a gradient. Furthermore, due to the fact that the present method does not require bidirectional gradient fields, it is also preferable in terms of the patient's safety, since the changing rates of a magnetic field are only half of what they are in methods requiring the reversal of gradient direction. At the moment, the maximum reversal rate of gradient fields recommended in the USA and Finland is 3 T/s, which will probably become an international standard. In a technical sense, the lower reversal rate of a magnetic field is preferable also in connection with supraconductive magnets because of lower eddy currents inducing in the body of a magnet. Eddy currents slow down the reversal of gradient fields and, in order to attain the reversal rate, it is necessary to apply great gradient powers.

Figure 1B:
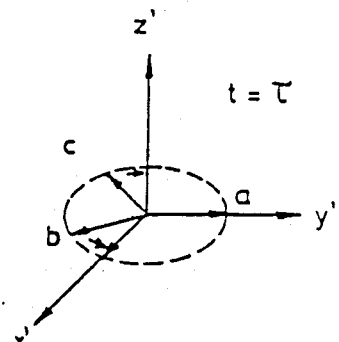
Figure 1C:
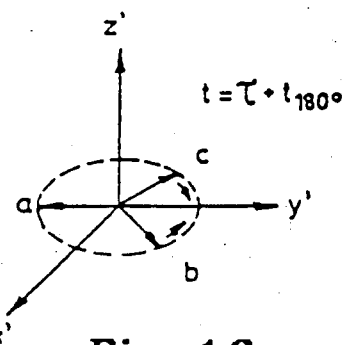
Figure 1D:
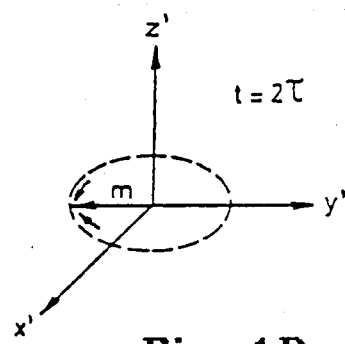
Figure 1E:
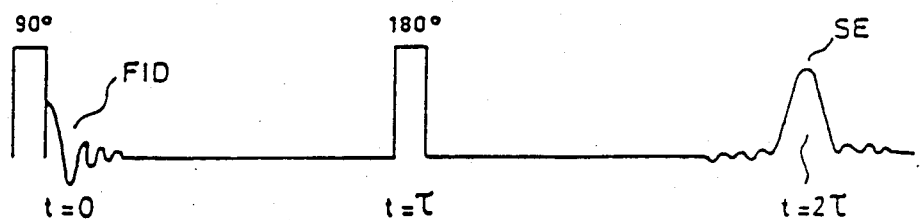

Working of the method according to the invention has been illustrated in the accompanying drawing, in which FIG. 1A shows the rotating transverse magnetization m resulting from application of a 90° pulse, FIG. 1B shows variations, a, b, and c, in the magnetization produced by inhomogeneties in the magnetic field, FIGS. 1C and 1D show refocusing of the transverse magnetization by application of a 180° pulse, and FIG. 1E is a time graph showing application of the 90° pulse, the free induction decay signal (FID), application of the 180° pulse, and the spin echo signal (SE).

Figure 2:
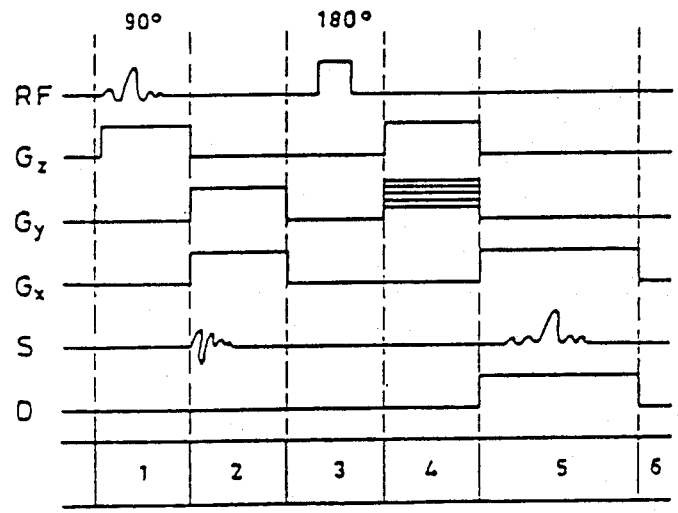
Figure 3:
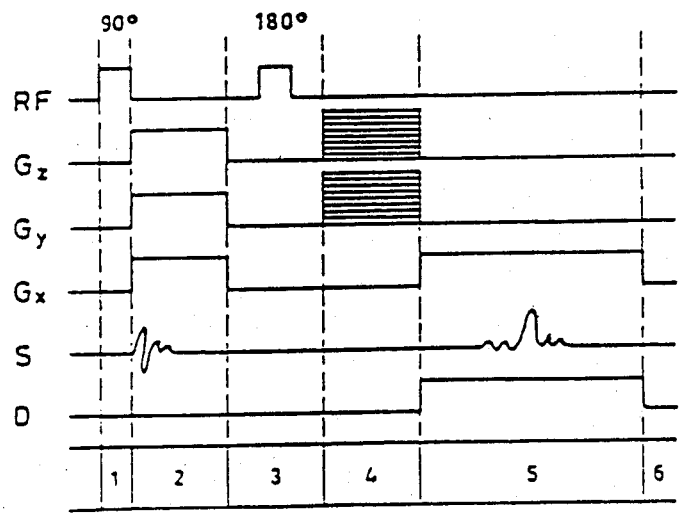
Figure 4:
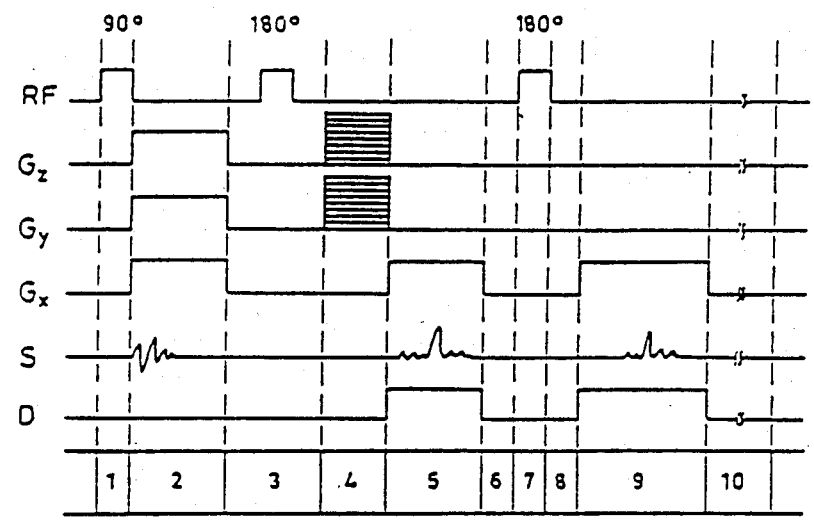
Figure 5:
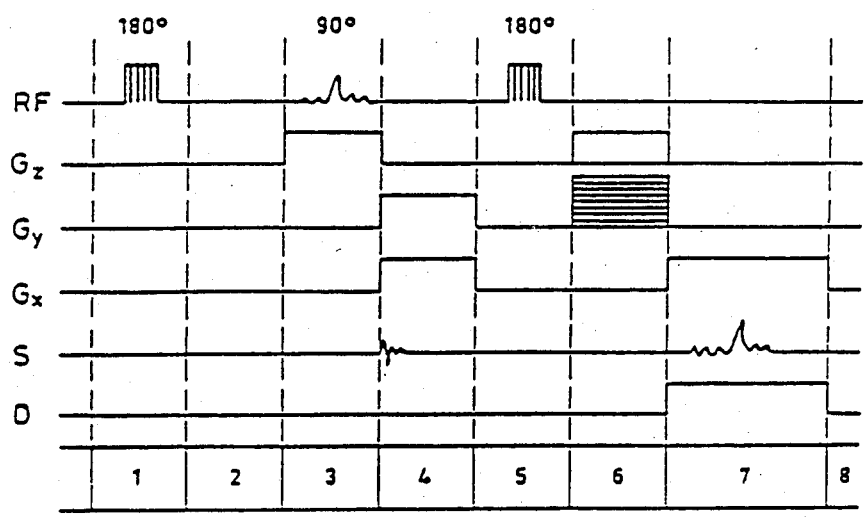
Figure 6A:
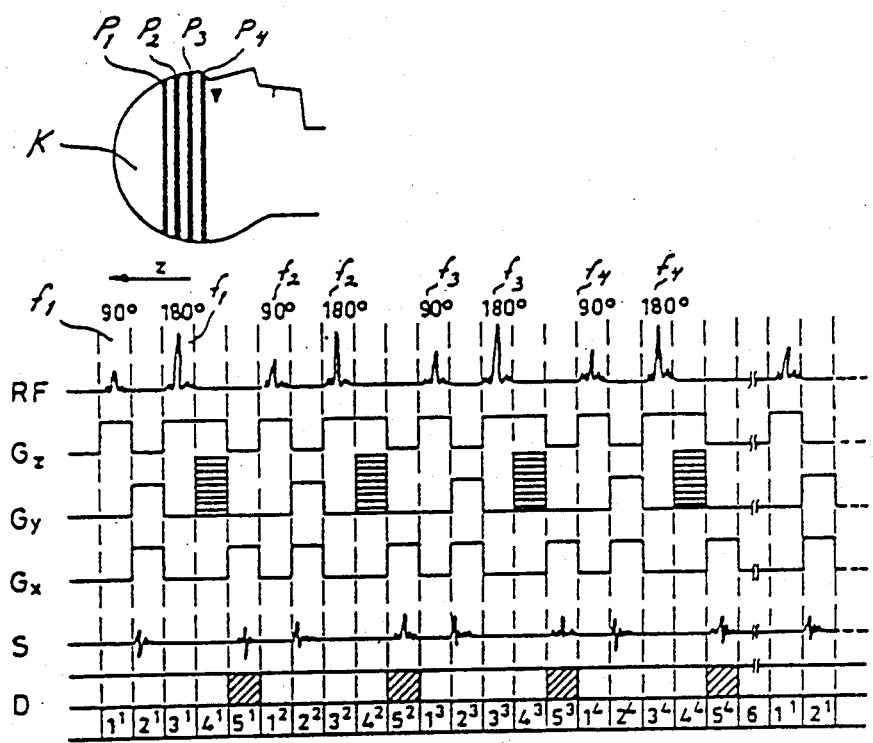
Figure 7:
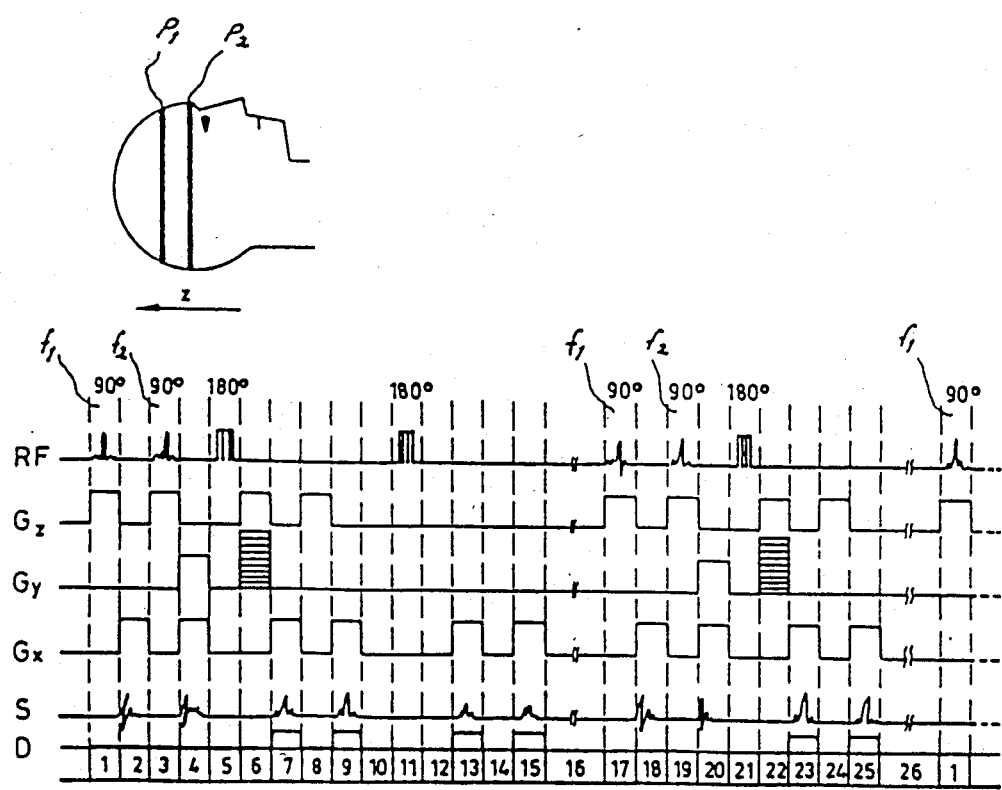

FIG. 2 shows one simple method of the invention of producing a two-dimensional image, FIG. 3 shows a method of the invention of producing a three-dimensional image, FIG. 4 shows a method of the invention of collecting $T_2$ information for imaging, FIG. 5 shows a method of the invention of collecting $T_1$ information for imaging, FIGS. 6A and B show two methods of the invention of collecting image information from a three-dimensional target for the production of images of a plurality of successive slices, FIG. 7 shows one method of the invention of collecting image information from two slices of a target, including the $T_1$ and $T_2$ information of said target.

FIG. 1 is a general representation of the generation of a spin echo in the manner the invention is based on. In an inhomogenous magnetic field, the magnetization of a bunch of nuclei is deflected with a 90° pulse from the direction of a magnetic field $B_E$ ($B_E$ is parallel to axis z'). In the beginning, the various components of nuclear magnetization are parallel and their resultant m is wound in the plane x' y' of so-called rotating coordinates x' y' z' (FIG. 1A). FID is a Free Induction Decay signal. After the time $\tau$ (FIG. 1B), the field inhomogeneity applied to said bunch of nuclei has mixed the phases of nuclear magnetizations and this has been illustrated in FIG. 1 by dividing magnetization m into three components: c which is in a stronger field, a which sees a field that corresponds to the rotating frequency of coordinates x' y' z', and b component which is in the smallest field. The arrows indicate the rotating direction of these components relative to coordinates x' y' z'. At the moment $\tau$, the bunch of nuclei is subjected to a 180° pulse whose magnetic component is parallel to x'. This pulse rotates the magnetization components through 180° relative to x' axis and FIG. 1C shows the situation immediately after the pulse, i.e. at the moment $t=\tau+t_{180}$, wherein $t_{180}$=duration of 180° pulse. As illustrated in FIG. 1D, at the moment $t=2\tau$, the various components of magnetization are again in the same phase and their resultant is m. At the moment $t=2\tau$, a so-called spin echo SE is also at its maximum. It can be noted that the illustrated pulse sequence can be used to eliminate the action of field inhomogeneities.

The above per se known method of generating a spin echo compensates completely for field inhomogeneities contray to that set forth in the cited reference Hutchison et al: WO No. 81/02788 wherein the echo is generated by reversing an electrically created field gradient which lies across the target.

In FIGS. 2 . . . 7, X, Y, Z represents orthogonal coordinates placed over a target, $G_x$ is an x-oriented magnetic field gradient, $G_y$ is a y-oriented magnetic field gradient and $G_z$ is a z-oriented magnetic field gradient, respectively. $B_o$ is a homogenous magnetic field applied to a target and S is a nuclear magnetic resonance signal. Said figures further show on D-axis the times of signal collection and on RF-axis the transmission times of excitation pulses.

FIG. 2 shows one pulse sequence of the invention for the production of a two-dimensional image.

Applied to a target is a z-oriented gradient (phase 1 in FIG. 2) and simultaneously the target is excited with a narrow-band radiofrequency pulse which tips the magnetization 90° from the direction of a magnetic field applied to the target.

In phase 2, applied to the target are x- and y-oriented field gradients which are used to phase code the magnetization of a bunch of nuclei:

$$M(t) = \int_{x,y} A(x,y) e^{j\phi(x,y,t)} \tag{1}$$

Wherein
$A_{(x,y)}$ is nuclear density at x, y and $\phi(x, y, t)$ is a phase coding caused by $G_x$ and $G_y$ at x, y
And phase coding at the end of phase 2

$$\phi(x,y,t_2) = \int_{\Delta t_2} \gamma(g_x + g_y)dt \tag{2}$$

Wherein
$\Delta t_2$ is the duration of phase 2,
$\gamma$ is a so-called gyromagnetic ratio,
$g_x$ is the strength of gradient $G_x$ at x,
$g_y$ is the strength of gradient $G_y$ at y
Gradients $G_x$ and $G_y$ need not be constants during period 2. Thus, it is true:

$$\phi(x,y,t_2) = \int_{\Delta t_2} \gamma(g_x(t) + g_y(t))dt \tag{3}$$

In phase 3, all gradients are removed and the target is excited by using a 180° pulse. During this phase it is also possible that gradient $G_x$ is continuously applied but, in this case, care must be taken that the 180° pulse is of sufficiently wide band. It is also possible that said 180° pulse is selective in z-direction, $G_z$ gradient being then applied. In phase 4, gradient $G_y$ is connected in a manner that $$\phi_n(x,y,t_4) = \pi - \phi(x,y,t_2) + \int_{\Delta t_4} \gamma g_y(t)dt \tag{4}$$

wherein
$\phi_n(x, y, t_4)$ is a phase at the end of period 4,
$\phi_{max}$ is pulse sequence repetition time $n\epsilon[1, N]$
N is the number of repetition times $$\Delta\phi(y) = \int_{\Delta t_2} \gamma g_y(t)dt - \int_{\Delta t_4} \gamma g_y(t)dt = G_{max}y\left(\frac{2n-N}{N}\right) \tag{5}$$

wherein is also determined the function $\Delta\phi(y)$ of y-oriented phase coding.

As noted, the 180° pulse serves as a converter of phase direction: the phase orientation preceding the 180° pulse converts into the opposite mark with the exception of constant term $\pi$. In the following, said 180° constant term can be ignored.

It should be noted that it is not essential whether the amplitude or duration of $G_y$ is changed during periods 2 and 4, what is essential it that time integrals of the gradients fulfil the condition of formula (4).

Immediately at the end of phase 4, the status of a spin system can be described as follows $$M(t_4) = \int_{x,y} A(x,y) e^{j\phi_n(x,y,t_4)} \tag{6}$$

In phase 5, the x-oriented gradient $G_x$ is connected which produces a signal $$S_n(t) = \int_{x,y} A(x,y) e^{j(\phi_n(x,y,t_4) + \int_{t_4}^{t} \gamma G_x dt')} \tag{7}$$

If the value of $\phi_n(x, y, t_4)$ on various cycles is varied between $[-\phi_{max}, \phi_{max}]$, it is possible during phase 5 to collect a bunch of nuclei:

$$S_n(t) = \int_{x,y} A(x,y)e^{j(\phi n(x,y,t4)+\int_{t4}^{t} \gamma Gx dt')} \quad (8)$$

The signals $S_n$ are subjected to Fourier transform with respect to time.

$$\bar{S}_n(\omega) = \int^{t5} S_n(t)e^{-j\omega t}dt \quad (9)$$

$$\bar{S}_n(\omega) = \int_y A\left(\frac{\omega}{\gamma G_x}, y\right) e^{j\phi n\left(\frac{\omega}{\gamma G_x}, y, t4\right)} \quad (10)$$

By subjecting this again to Fourier transform in the the direction of n $$S_k(\omega) = \sum_{n=-\frac{N}{2}+1}^{n=+\frac{N}{2}} \bar{S}_n(\omega)e^{-j2\pi kn/N} \quad (11)$$

$$|S_k(\omega)| = \left| A\left(\frac{\omega}{\gamma G_x}, \frac{\Delta\phi(y)}{\gamma G_y}\right) \right| \quad (12)$$

$$\frac{\omega}{\gamma G_x} = x \quad ja \quad \frac{\Delta\phi(y)}{\gamma G_y} = y$$

or $\bar{\bar{S}}(\omega, n_4) \triangleq A(x, y)$ i.e. a spin density image of the target.

One preferred embodiment of the invention is to effect phase-encoding first on one side of a 180° pulse and, as signal collection or recovery proceeds, to shift the encoding over to the other side of a 180° pulse.

The method can be expanded to three-dimensional distribution A(x, y, z) by adding, according to FIG. 3, to phase imaging an encoding gradient in z-direction and by making all excitation pulses non-selective.

According to the invention, the method can also applied to imaging of distribution T₂(x, y, z) of so-called relaxation time T₂ (so-called spin-spin relaxation time). According to the method shown in FIG. 4, as a continuation of the pulse sequence shown in FIG. 3, a target is re-excited with a 180° pulse in phase 7 (phase 6 is about 20...60 ms delay), so that the relaxation process would have time to take effect. Phase 8 again is about 20...60 ms delay, a signal is recovered in phase 9 and the above sequence is repeated. Prior to the repetition, a spin system is allowed to recover in phase 10. This delay is preferably in the order of 1–3 times the longest relaxation time T₁ occurring in a target. After the repetition time N, it is possible to use signals recovered during phases 5 and phases 9 in order to produce so-called spin density and T₂ activated images. On the basis of these images, it is also possible to calculate the distribution of T₂ relaxation times, since:

$$A_{T2}(x,y,z) = A(x,y,z)e^{-\frac{\Delta t}{T2(x,y,z)}} \quad (13)$$

wherein
T₂(x, y, z) is relaxation time T₂ at point x, y, z,
A(x, y, z) is the spin density distribution of a target (registered in phase 5),
$A_{T2}$(x, y, z) is the T₂ activated distribution of a target (registered in phase 9),
Δt is time delay from phase 1 to phase 9 wherein relaxation process T₂ is effective.

Even distribution T₁(x, y, z) of relaxation time T₁ (spin-lattice relaxation time) can be mapped by effecting according to FIG. 5 an independent sequence so that the nuclear magnetization of a target is reversed with a 180° pulse and, following a certain recovery time, the image forming is effected according to the above description (FIG. 5). In reference to FIG. 5, the magnetization of a target is reversed 180° in phase 1. The magnetization recovers during phase 2 at a rate defined by relaxation time T₁. The recovery time is phase 2 whose duration in the examinations of biological tissues varies between 200 ... 500 ms. Following phase 2, a target volume is excited with a selective 90° pulse and thereafter the imaging sequence is effected exactly as described above in connection with FIG. 2. In phase 7, a spin echo is recovered and its intensity is effected by the relaxation time of a target with a factor $(1-\exp(-\tau_2/T_1))$ wherein $\tau_2$ is the duration of phase 2 and T₁ is the relaxation time of a target.

Another way of finding out T₁ distribution is to utilize the imaging sequence of distributions A(x, ẏ, z) and $A_{T2}$(x, y, z) of a target and to effect the re-imaging after delay time $\tau_2$ of the first excitation pulse of preceding sequences. Thus, the signal intensity $A_{T1}$(x, y, z) is $$A_{T1}(x,y,z) = A(x,y,z)(1 - e^{-\Delta\tau_2/T_1}) \quad (14)$$

If a preceding 180° pulse is used, the signal intensity will be $$A_{T1}(x,y,z) = A(x,y,z)(1 - 2e^{-\tau_2/T_1}) \quad (15)$$

On the basis of this information, it is also possible to calculate distribution T₁(x, y, z).

Different tissues have their inherent parameter combinations. However, the variation ranges of parameters are wide, so the combination ranges of various tissues are partially overlapping.

On the basis of a signal recovery method of the invention, it is possible to provide an apparatus in which it is plausible to set up desired parameter windows and thus to indicate automatically in a target volume to be examined the range for certain tissues and other materials and to calculate from a three-dimensional image the volumes of these areas.

In addition to a three-dimensional image, the method of the invention can be applied to produce slice images of a target volume by exciting various slice planes successively, whereby signals can be continuously recorded of a target volume and recovery of image information is activated.

This can be effected by repeating the pulse sequence of FIG. 2 in a manner that different excitation frequency is used in successive repetition times and thus various planes are excited. While the magnetization of preceding planes is recovering, signals are excited and recorded from other planes.

FIGS. 6A and B show two alternative ways of producing slice images by applying the method of the invention according to the above principle.

FIG. 6A shows one pulse sequency for recovering or collecting information of a target or object K from successive slices P₁, P₂, P₃, P₄. The image forming phases of individual slices, as for instance slice P₁, correspond to phases 1 ... 5 illustrated in FIG. 2. Sequencies for various slices differ at excitation phase $1^1$, $1^2$, $1^3$, $1^4$ in a manner that the target is subjected to an excitation pulse at different frequencies $f_1$, $f_2$, $f_3$, $f_4$ for excitation of respective slices. In phase 6, the nuclear magnetization of various slices is allowed to recover in a manner that the interval of successive excitation times of each plane is in the order of $T_1$.

Figure 6B:
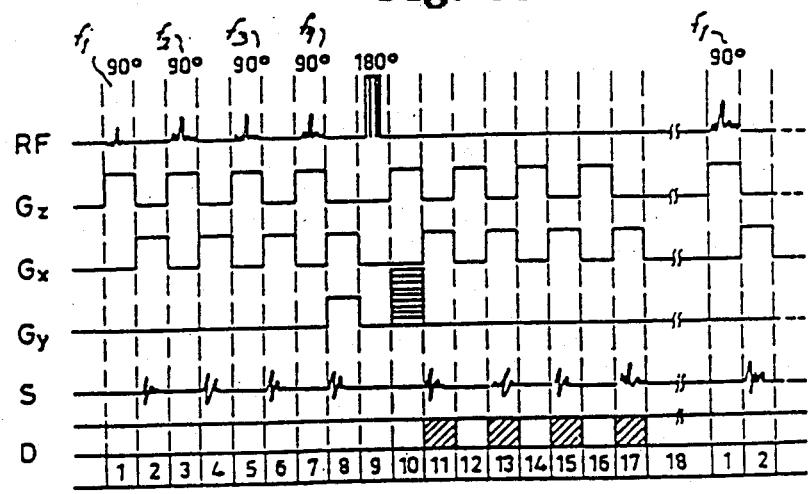

A more favourable way is to utilize the properties of a 180° pulse as shown in FIG. 6B. In the pulse sequence shown in FIG. 6B, the slices are first excited successively by first exciting selectively slice $P_1$ by applying a selective 90° pulse whose frequency is $f_1$. Thus, also field gradient $G_z$ is connected (phase 1).

In phase 2, gradient $G_x$ is connected for the generation of a spin echo. Phases 3 ... 8 are respective procedures effecting the excitation and x-directed phase orientation on slices P2 ... P4.

Further in phase 8, the phase is preorientated according to the invention in y-direction by means of a y-directed gradient whose strength during phase 8 is $G_y \geq 0$. In phase 9, the target is subjected to a non-selective 180° pulse. In phase 10, there is connected gradient $G_z$ in a manner to produce a spin echo from plane P4 in phase 11. Thus, the amplitude of gradient $G_z$ must fulfil the condition $$\int_{\Delta t_{10}} G_z(t)dt = G_z^7(\text{eff}) \tag{16}$$

wherein $\Delta t_{10}$ is duration of phase 10

$G_z^7$ (eff) is a z-directed gradient seen by the nuclear magnetic system of slice P4 during excitation pulse in phase 7, which gradient depends on the properties of excitation pulse.

Generally $$G_z^7(\text{eff}) \approx 0.6 \int_{\Delta t_7} G_z(t)dt$$

During phase 10 there is also effected phase orientation in y-direction by means of gradient $G_y$. In phase 11 there is connected gradient $G_x$ and the resulting spin echoe is recorded. Then, it must be noted that the echo contains information about slice P4.

In phase 12, gradient $G_z$ is connected so as to produce a spin echo from plane $P_3$ in phase 13. Thus, the amplitude of gradient $G_z$ must fulfil the condition $$\int_{\Delta t_{12}} G_z(t)dt = G_z^5(\text{eff}) + \int_{\Delta t_7} G_z(t)dt - G_z^7(\text{eff}) \tag{17}$$

The phase orientation effected during phase 10 is also directed to all slices $P_1$ ... $P_4$, so it need not be repeated during phase 12.

In phase 13 there is connected gradient $G_x$ so as to produce a spin echo from slice $P_3$ and this signal is recovered.

Phase 14 is similar to phase 12 but $G_2$ must fulfil the condition $$\int_{\Delta t_{14}} G_z(t)dt = G_z^3(\text{eff}) + \int_{\Delta t_5} G_z(t)dt - G_z^5(\text{eff}) \tag{18}$$

During phase 15, there is connected a gradient $G_x$. This produces a spin echo from slice $P_2$ and the resulting signal is recorded.

In phase 16 there is connected the z-directed field gradient $G_z$ in a manner that the following condition is fulfilled $$\int_{\Delta t_{16}} G_z(t)dt = G^1(\text{eff}) + \int_{\Delta t_3} G_z^3(t)dt - G_z^3(\text{eff}) \tag{19}$$

Connected in phase 17 is field gradient $G_x$ and the spin echo generated by slice $P_1$ is recorded.

The amplitudes of gradients $G_x$ must be selected e.g. in such a manner that $$\int_{\Delta t_i} G_x(t)dt = C \tag{20}$$

wherein $i = 11, 13, 15, 17$ $C = $ constant $$\int_{\Delta t_2} G_x(t)dt = 2 \int_{\Delta t_4} G_x(t)dt \tag{21a}$$

$$\int_{\Delta t_4} G_x(t)dt = 2 \int_{\Delta t_6} G_x(t)dt \tag{21b}$$

$$\int_{\Delta t_6} G_x(t)dt = 2 \int_{\Delta t_8} G_x(t)dt \tag{21c}$$

$$\int_{\Delta t_8} G_x(t)dt = \tfrac{1}{2}C \tag{21d}$$

Also other combinations of gradient $G_x$ can be applied. It is essential, however, that the echoes generating from slices can be timewise separated from each other.

In addition, in real imaging sequence, the time delay between phases 1 ... 17, or between excitation of the first slice and generation of the echo, is substantially shorter than the shortest relaxation time $T_2$ of the materials to be examined in a target volume.

For this reason it is preferable to combine the signal recovery alternatives shown in FIGS. 6A and 6B in a manner that information is first recovered from the first array of slices and thereafter from the following arrays of slices.

During phase 18 the magnetization of previously excited planes relaxes whereafter the signal recovery can be repeated. The duration of phase 18 is about 2 ... 3 times more than $T_1$ of the material to be imaged.

During phase 18 it is naturally possible to recover information from the following array or arrays of slices, as described above. Then, it must be remembered, however, that in the above-described pulse sequence use is made of a wide-band 180° non-selective pulse (phase 9) and this reverses the object of magnetization in the parts that have not been earlier excited with a 90° pulse. The reversed magnetization can be quickly returned to its state of rest by applying so-called adiabatic fast passage or a 180° non-selective pulse. This should be done, especially if the described sequences are effected on several arrays of slices, because otherwise relaxation process $T_1$ weakens the signal considerably.

In order to describe the distribution of relaxation times $T_1$ and $T_2$, the invention can also be applied by modifying the above multi-plane method. The following example describes the application of the sequence shown in FIG. 6B for explaining the proton density, $T_1$ and $T_2$ distributions.

For the sake of clarity, FIG. 7 illustrates the imaging sequences of proton density, $T_1$ and $T_2$ distributions of two slices $P_1$ and $P_2$ which are perpendicular to z-direction. Phases 1 ... 9 correspond to those described above and the strengths of gradients and nature of excitation pulses are exactly the same as above.

Phase 10 is a delay before a 180° non-selective excitation pulse to be given at point 11. During the delay, the spin-spin relaxation processes inherent of the target materials are active as also during phase 12 which is a delay of the same duration as in phase 10.

In phase 13, gradient $G_x$ is connected for generation of the spin echo of slice $P_1$ and during this phase the $T_2$ activated information of slice $P_1$ is recovered. Phase 14 is of the same duration as phase 8 in order to avoid the effects of field inhomogeneity on the spin-spin relaxation or $T_2$ activated information of slice $P_2$ to be recovered during phase 15. Thus, the procedure is analogous to that set forth in FIG. 5.

Exactly the same way as in the case of a single slice, the spin-lattice or $T_1$ activated information can be recovered in a manner that, after phase 15, the magnetization is allowed to recover during a certain period. In FIG. 7, this delay is phase 16. Following phase 16, the same pulse sequence is repeated as in phases 1 ... 9. If the duration of phase 16 is properly selected, the signals recovered in phases 23 and 25 are, according to formula 14, dependent on the $T_1$ distribution of a target.

In order to clarify the $T_1$ distribution, it is also possible to apply a pulse arrangement, wherein the actual imaging sequence is preceded by a 180° excitation pulse and delay cycle. This 180° pulse may be selective or non-selective. Instead of pulse excitation it is possible to use non-selective adiabatic passage. In the selective case, selectivity in the preceding arrays of 180° pulses is the same as in the arrays of 90° pulses of later or following imaging sequences.

In order to fully exploit the benefits offered by the method of the invention in terms of compensating for the inhomogeneities of a basic magnetic field, the strengths and connection times of said first, second and third magnetic field gradients must be selected so that the resulting spin echoes are timewise as far away from the 180° pulses therebetween, in other words, symmetrically with respect to the latter. Likewise, said 90° pulses and the respective first spin echoes must be timewise symmetrical relative to the 180° pulses therebetween.

The local distribution in a target volume of the NMR information recovered as described above can either be visualized on a graphical display means, such as a video monitor or a recorder or recorded on a suitable recording means, such as film, magnetic tape, video discs or solid state memory. The information recovered can be further used without visualization or recording for indicating normal or abnormal changes in the structure of a target body and for directing the later, more accurate examinations.

The invention is not limited to the above embodiments but a plurality of modifications can be considered plausible within the scope of the annexed claims.

I claim:

1. A method of recovering nuclear spin or NMR information from a target volume, such as a human body, placed in an at least substantially homogenous magnetic field by exciting a desired part of said target volume by means of a first radiofrequency pulse which deviates nuclear magnetization preferably 90°, by generating a spin echo by utilizing a second excitation pulse which preferably deviates nuclear magnetization 180°, by recording said spin echo, and by repeating said excitation sequence, characterized in that along one axis of the target volume at least one magnetic field gradient is sequentially and repetitively applied, at least one of the duration and amplitude of said magnetic field gradient being varied in each repetition of the sequence such that the difference between the absolute values of the time integral of said magnetic field gradient following said 180° second excitation pulse and the time integral of said magnetic field gradient preceding said 180° second excitation pulse differs in each repetition of the sequence.

2. A method as set forth in claim 1, characterized in that said magnetic field gradient is varied at various repetitions of said excitation sequence such that the difference of time integrals of said magnetic field gradient obtains values from one preselected extreme value to a second preselected extreme value.

3. A method as set forth in claim 1 characterized in that a plurality of separated volume elements are initially excited in the target volume and thereafter the target volume is subjected to said second excitation pulse for the generation of spin echoes in all excited voxels.

4. A method as set forth in claim 3, characterized in that said imaging sequence initially effects at least one voxel and thereafter other voxels.

5. A method as set forth in claim 1, characterized in that following said second excitation pulse, the target is subjected to a third excitation pulse for the generation of a second spin echo.

6. A method as set forth in claim 5, characterized in that the $T_2$ or spin-spin relaxation activated image information about the structure of the target volume is obtained from said second spin echo.

7. A method as set forth in claim 5, characterized in that following said third excitation pulse the target volume is subjected to a fourth excitation pulse and thereafter to a fifth excitation pulse for the generation of a third spin echo.

8. A method as set forth in claim 7, characterized in that said fourth excitation pulse is a 90° pulse and said fifth excitation pulse is a 180° pulse.

9. A method as set forth in claim 7 or 8, characterized in that the $T_1$ or spin-lattice relaxation image information about the structure of a target is obtained from said third spin echo.

10. A method as set forth in claim 1 of recovering local distributions of nuclear spin or NMR information for determining the density of certain element nuclei and relaxation times associated with the nuclei including a spin-spin or $T_2$ relaxation time and a spin-lattice or $T_1$ relaxation time from a target, such as a human body, placed in an at least substantially homogenous magnetic field, characterized in that said NMR information is recovered from the desired volume to be examined in said target by the following steps:

a. a first magnetic field gradient is applied and directed to the target and a first excitation signal is applied to the target, the strength, frequency and duration of which are such that a desired volume of the target is excited and the nuclear magnetization of said volume spins preferably 90°, b. the first magnetic field gradient and excitation signal are removed and second and third magentic field gradients are applied to the target, c. the target is subjected to a second excitation pulse the strength, frequency and duration of which are such that the nuclear magnetization of the previously excited volume of said target spins preferably 180°, d. said second magnetic field gradient is set at a predetermined value, e. said second magnetic field gradient is removed and said third magnetic field gradient is set at a predetermined value, f. the resulting spin echo is recorded, g. the above sequence of procedures is repeated several times as necessary until sufficient amount of information is recovered.

11. A method as set forth in claim 10, characterized in that prior to said step c and thus prior to the spinning of nuclear magnetization through 180°, said second and third magnetic field gradients are removed.

12. A method as set forth in claim 10 or 11, characterized in that said first magnetic field gradient is set at its predetermined value following said second excitation in step c and removed prior to the signal recording effected in step f.

13. A method as set forth in claim 3, wherein a target to be imaged is placed in an at least substantially homogenous magnetic field, characterized in that NMR information is adapted to be recovered by the following steps:

a. the target is subjected to a first magnetic field gradient, b. the target is subjected to a first excitation pulse, the strength, duration and frequency of which are such that a desired part of the target is excited, c. said first magnetic field gradient is preferably removed and a second magnetic field gradient is applied to a predetermined value, d. said second magnetic field gradient is preferably removed and said first magnetic field gradient is applied to the target, e. the target is subjected to an excitation pulse, the strength, duration and frequency of which are selected such that a desired previously non-excited voxel of the target is excited, f. the above sequence is repeated starting from step c according to the number of voxels of target desired to be excited, said excitation pulses comprising the first excitation pulses of the target, g. said first magnetic field gradient is removed and said second magnetic field gradient is applied to said target to a predetermined value thereof; and a third magentic field gradient is applied to said target to a predetermined value thereof, h. the target is subjected to a second excitation pulse, the strength, duration and frequency of which are such that the nuclear magnetization of all previously excited voxels of said target spins preferably 180°, all field gradients being preferably removed during this phase, i. said first magnetic field gradient is applied to the target in a manner such that its time integral corresponds to the effective time integral of said first magnetic gradient field over the voxel prevailing during the excitation next and prior to the above step f, and simultaneously said third magnetic field gradient is applied to the target at a predetermined value, j. said first and third magnetic field gradients are removed and said second magnetic field gradient is applied to the target to its predetermined value and the resulting spin echo is recorded, k. said first magnetic field gradient is applied to the target in a manner such that its time integral corresponds to the effective time integral of said first gradient field prevailing over the voxel next and prior to step f during the excitation, l. said first magnetic field gradient is removed and said second magnetic field gradient is applied to the target to its preselected value and the resulting spin echo is recorded, m. steps k, j, and l are repeated according to voxels of the target excited in order to record the spin echo also from the voxel first excited in step b, and n. the above steps a . . . m are repeated several times as necessary until sufficient amount of information is recovered from the array of voxels excited.

14. A method as set forth in claim 13, characterized in that said sequence of steps a . . . n is first effected on one array of voxels and thereafter successively on other arrays of voxels.

15. A method as set forth in claim 13 or 14 characterized in that in addition to said second excitation pulse, the target volume is subjected to a third excitation pulse in the form of another 180° pulse for the generation of second spin echos from the target volumes.

16. A method as set forth in claim 15, characterized in that on the basis of said second spin echoes there is processed the $T_2$ or spin relaxation activated image information about the voxels.

17. A method as set forth in claim 13 or 14, characterized in that prior to said first excitation pulses the target volumes are subjected to an excitation which spins the nuclear magnetization of target volumes through 180°, and that each of said sequences of steps a . . . m is effected after a certain delay from said 180° pulse.

18. A method as set forth in claim 17, characterized in that there is processed from the recovered information the $T_1$ or spin-lattice relaxation activated images of the voxels.

19. A method as set forth in any of the claims 13, 15 or 16, characterized in that following said first excitation pulses, after a certain delay, said steps a . . . n are repeated and the resulting spin echoes are repeated.

20. A method as set forth in claim 19, characterized in that the recorded spin echoes are used to produce the $T_1$ or spin-lattice relaxation activated images of the voxels.

21. A method as set forth in claim 10 or 13, characterized in that said first, second and third magnetic field gradients are orthogonal relative to each other.

22. A method as set forth in claim 10 or 13, characterized in that said gradient fields are applied in a manner such that the 90° first excitation pulses and the resulting spin echoes are timewise symmetrical relative to the 180° pulse therebetween.

23. A method as set forth in claim 10 or 13, characterized in that preferably the second and subsequent spin echoes are timed symmetrically with the preceding spin echoes relative to the 180° second excitation pulses therebetween.

24. A method as set forth in claim 10 or 13, characterized in that the successive 180° second excitation pulses are selected to be 180° phase shifted so that the inhomogeneities of said exciting fluctuating magnetic field are compensated for.

25. A method as set forth in claim 10 or 13, characterized in that the recovered NMR information is combined into an image which is a weighted result of said nuclear density and relaxation value distributions.

26. A method as set forth in claim 25, characterized in that each parameter to be examined is previously given limit values and only those target volumes that remain within these limit values are displayed or otherwise indicated from the resulting image.

27. A method as set forth in claim 2, characterized in that the difference in magnetic field gradient time integrals varies by a constant amount in successive repetitions.

* * * * *